United States Patent [19]
Han

[11] Patent Number: 6,130,447
[45] Date of Patent: *Oct. 10, 2000

[54] INTEGRATED CIRCUIT MEMORIES AND POWER DISTRIBUTION METHODS INCLUDING AT LEAST TWO CONTROL LINES BETWEEN ADJACENT POWER LINES

[75] Inventor: Jin-man Han, Seoul, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 09/061,390

[22] Filed: Apr. 16, 1998

[30] Foreign Application Priority Data

Apr. 25, 1997 [KR] Rep. of Korea ...................... 97-15533

[51] Int. Cl.⁷ .............................. H01L 27/10; H01L 29/76
[52] U.S. Cl. .......................... 257/207; 257/208; 257/210; 257/390
[58] Field of Search ................................... 257/390, 207, 257/208, 210

[56] References Cited

U.S. PATENT DOCUMENTS 5,698,872 12/1997 Takase et al. ............................ 257/207
5,763,908 6/1998 Han et al. ................................ 257/208

OTHER PUBLICATIONS

Yamada et al., "A 64–Mb DRAM With Meshed Power Line", IEEE Journal of Solid–State Circuits, vol. 26, No. 11, Nov. 1991, pp. 1506–1509.

*Primary Examiner*—Steven H. Loke
*Attorney, Agent, or Firm*—Myers Bigel Sibley & Sajovec

[57] ABSTRACT

At least two spaced apart control lines are located between adjacent spaced apart power lines on a memory cell array of an integrated circuit memory device. The spaced apart power lines preferably are wider than the spaced apart control lines, and the space between adjacent control lines preferably is equal to the space between a power line and an adjacent control line. Accordingly, the width of the power lines can be increased without requiring an increase in the size of the integrated circuit memory.

17 Claims, 4 Drawing Sheets

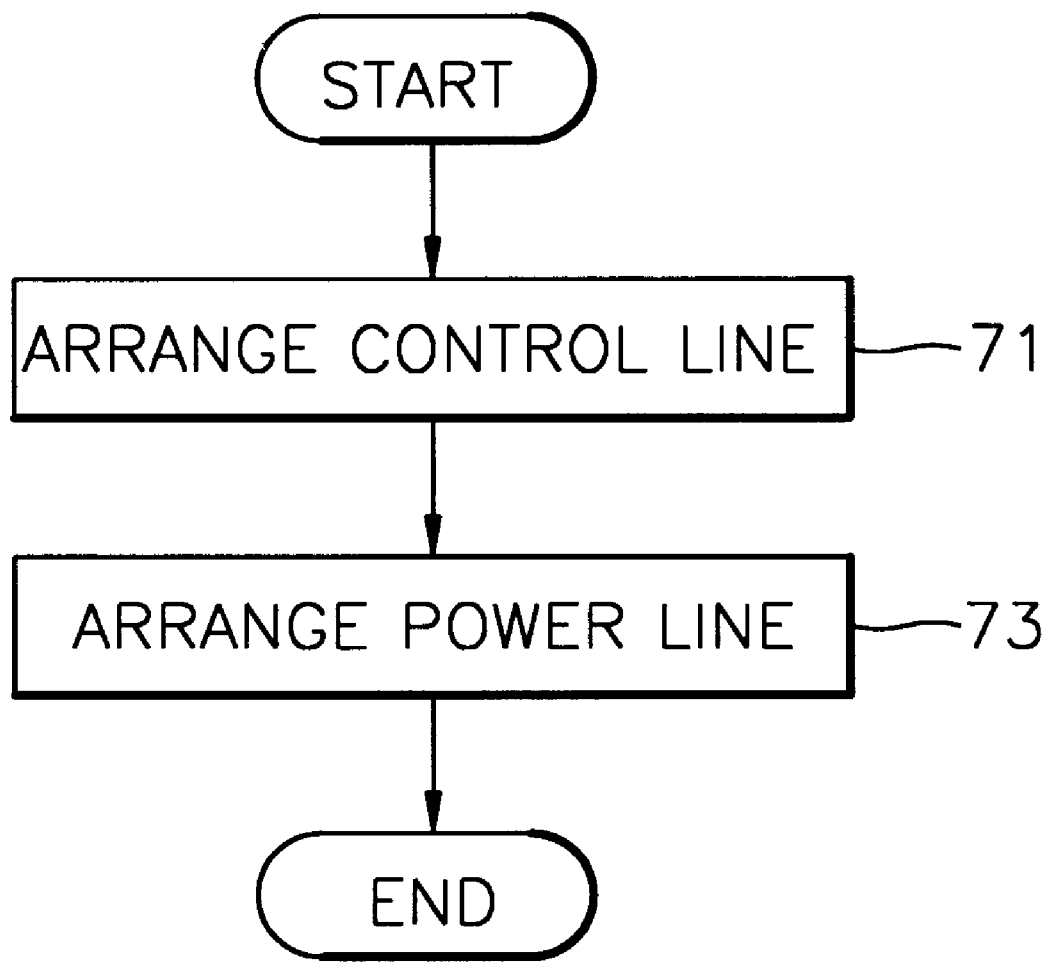

INTEGRATED CIRCUIT MEMORIES AND POWER DISTRIBUTION METHODS INCLUDING AT LEAST TWO CONTROL LINES BETWEEN ADJACENT POWER LINES

FIELD OF THE INVENTION

This invention relates to integrated circuit memory devices, and more particularly to power distribution for integrated circuit memory devices.

BACKGROUND OF THE INVENTION

Integrated circuit memory devices generally include a memory cell array in an integrated circuit and a plurality of control lines and power lines for the memory cell array. The control lines generally include column select lines that are connected to a column decoder. The power lines generally include VDD and VSS power lines that generally supply power at a power supply voltage and ground voltage respectively.

It is known to alternatingly arrange the VSS power lines and the column select lines in a "meshed" power line arrangement. See, for example, the publication by Yamada et al. entitled "*A 64-Mb DRAM With Meshed Power Line*", IEEE Journal of Solid-State Circuits, Vol. 26, No. 11, November 1991, pp. 1506–1509.

FIG. 1 shows an arrangement of power lines and column select lines in a conventional integrated circuit memory with meshed power lines. Referring to FIG. 1, an integrated circuit memory 10 includes a column decoder 13 and a memory cell array 11. A plurality of control lines, such as column select lines 15, are included on the memory cell array 11 and extend along a predetermined direction, shown as horizontal in FIG. 1. A plurality of power lines, such as VSS power lines 17, also extend in the predetermined direction, and are connected to a common VSS line at one end of the memory cell array 11. As shown in FIG. 1, the control lines 15 and the power lines 17 are alternatingly arranged on the memory cell array 11.

FIG. 2 is an enlarged view showing part A of the power line 17 and column select lines 15 of FIG. 1. As shown in FIG. 2, the power lines 17 and control lines 15 are alternatingly arranged. The width L1 of the control line 15 is the same as the width L2 of the power line 17. Also, the spaces S1 between an adjacent control line and power supply line are the same. As shown in FIG. 2, when the width L2 of the power line 17 increases, the resistance of the power line may be reduced and the capacitance may increase. This may reduce noise in the integrated circuit, to thereby improve operation of the integrated circuit memory. However, notwithstanding these improvements, there is a need for further improvements in the arrangement of control lines and power lines in meshed power line integrated circuit memory devices.

SUMMARY OF THE INVENTION

It is therefore an object of the present invention to provide improved arrangements of control lines and power lines on a memory cell array of an integrated circuit memory.

This and other objects are provided, according to the invention, by integrated circuit memory devices and methods of arranging the same, wherein at least two spaced apart control lines are located between adjacent spaced apart power lines on a memory cell array. The spaced apart power lines preferably are wider than the spaced apart control lines, and the space between adjacent control lines preferably is equal to the space between a power line and an adjacent control line. Accordingly, the width of the power lines can be increased without requiring an increase in the size of the integrated circuit memory.

Integrated circuit memories according to the present invention include a memory cell array in an integrated circuit, a plurality of spaced apart control lines on the memory cell array extending along a predetermined direction, and a plurality of spaced apart power lines on the memory cell array extending along the predetermined direction. At least two spaced apart control lines are located between adjacent spaced apart power lines. According to another aspect, the spaced apart power lines are wider than the spaced apart control lines.

According to yet another aspect, the space between adjacent control lines is equal to the space between a power line and an adjacent control line. The control lines are preferably column select lines, and the memory further comprises a column decoder connected to the column select lines. The power lines are preferably VSS power lines. In a preferred embodiment, the at least two spaced apart control lines is two or three spaced apart control lines. The power lines are at least twice as wide as the control lines.

Accordingly, power distribution is arranged in an integrated circuit memory by arranging a pair of spaced apart power lines on the memory cell array extending along the predetermined direction, and arranging at least two spaced apart control lines adjacent one another between the pair of spaced apart power lines and extending along the predetermined direction. It will also be understood that the spaced apart control lines may be arranged first, and then surrounded by a pair of spaced apart power lines.

BRIEF DESCRIPTION OF THE DRAWINGS

FIG. 7 is a flow chart representing methods for arranging control lines and power lines according to the present invention.

DETAILED DESCRIPTION OF PREFERRED EMBODIMENTS

Figure 1:
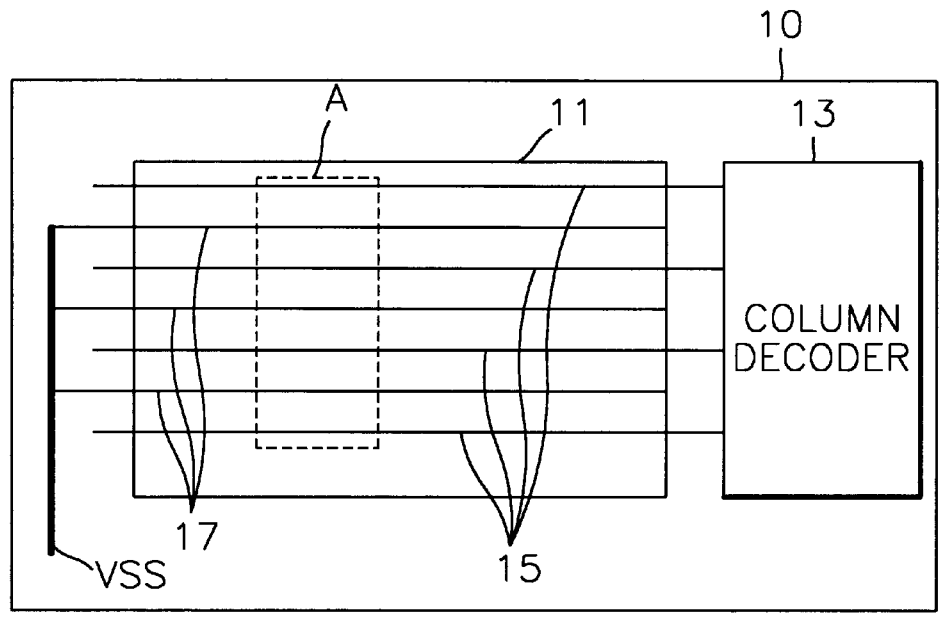
FIG. 1 shows an arrangement of power lines and column select lines in a memory cell array of a conventional integrated circuit memory.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3:
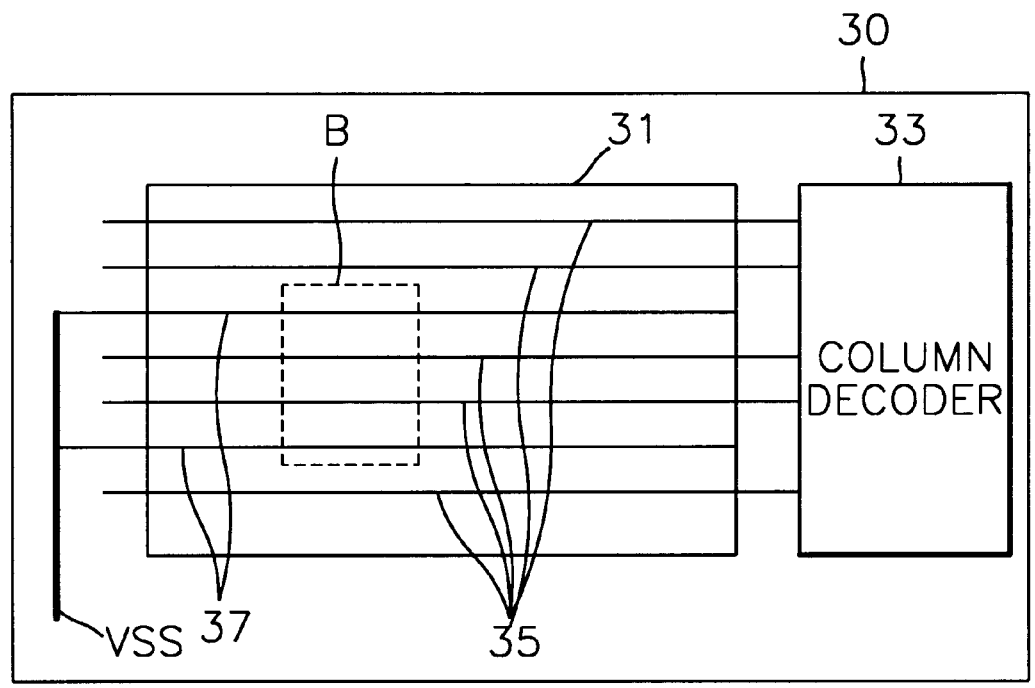
FIG. 3 shows an arrangement of power lines and column select lines in memory cell arrays of integrated circuit memories according to an embodiment of the present invention.

Referring to FIG. 3, integrated circuit memories 30 according to the invention include a column decoder 33 and a memory cell array 31. A plurality of spaced apart control lines, e.g., column select lines 35, and a plurality of spaced apart power lines, e.g., VSS power lines 37, are included on the memory cell array. The control lines and power lines extend along a predetermined direction, shown as horizontal. The plurality of column select lines 35 are connected to the column decoder 33. The VSS power lines 37 are connected to a common VSS line at one end of the memory cell array 31.

Figure 4:
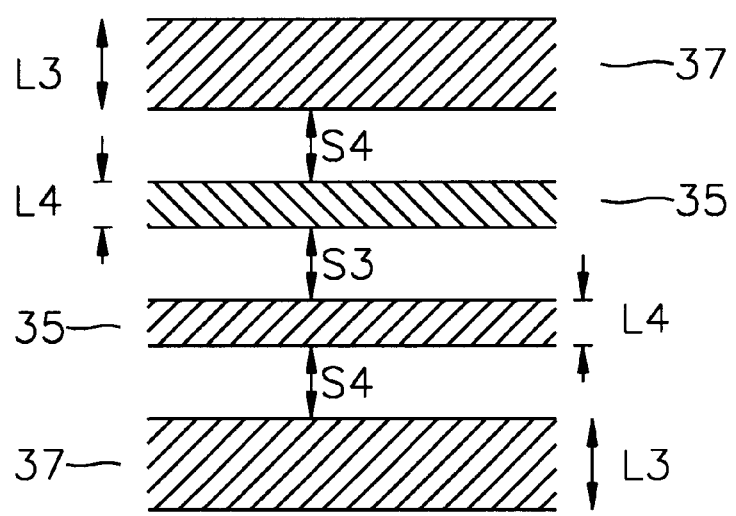
FIG. 4 is an enlarged view of part B of the power lines and the column select lines of FIG. 3.

FIG. 4 is an enlarged view of part B indicated by dotted lines in FIG. 3. Referring to FIG. 4, one VSS power line 37 is arranged per every two column select lines 35. The widths L4 of the column select lines 35 are equal. However, the width L3 of each VSS power line 37 is larger than, and preferably at least twice as large as, the width L4 of the column select line 35.

Figure 2:
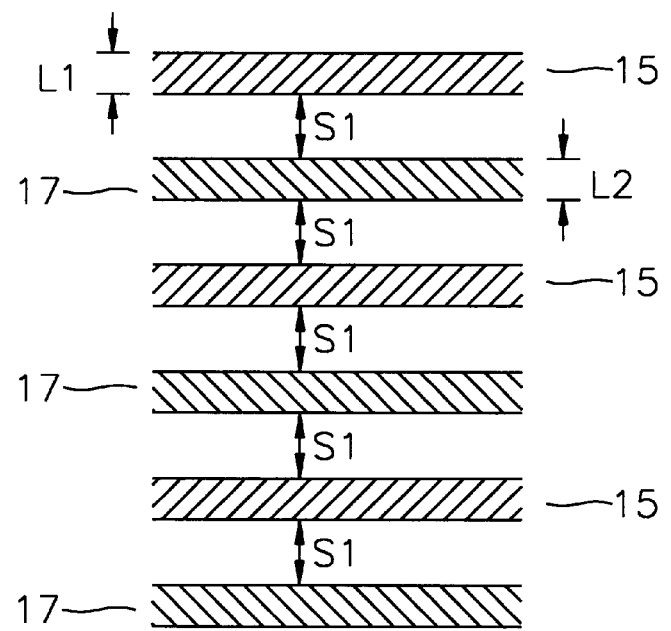
FIG. 2 is an enlarged view of part A of the power lines and the column select lines of FIG. 1.

Since one VSS line 37 is arranged per every two column select lines 35, the width L3 of the VSS power line 37 may be larger than the width L4 of the column select line 35. In detail, if a space S4 between a column select line 35 and a power line 37 is equal to a space S3 between two adjacent column select lines 35, the width of each of the power lines 37 may be three times larger than the conventional width shown in FIGS. 1 and 2, and the area of the power lines 37 may increase to 50% of the total area of the integrated circuit.

The increased widths L3 of the power lines 37 can reduce the resistance value of the power line 37, and increase the capacitance thereof. Accordingly, noise generated from the power lines 37 also can be reduced. For example, the noise of the VSS power line can be reduced by approximately 30%.

Figure 5:
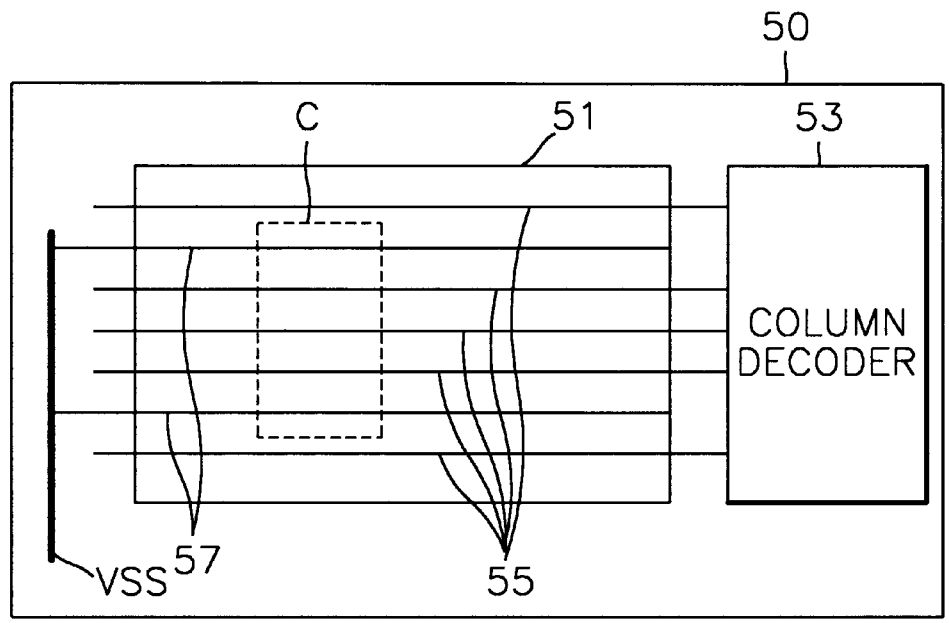
FIG. 5 shows an arrangement of power lines and column select lines in memory cell arrays of integrated circuit memories according to another embodiment of the present invention.
Figure 6:
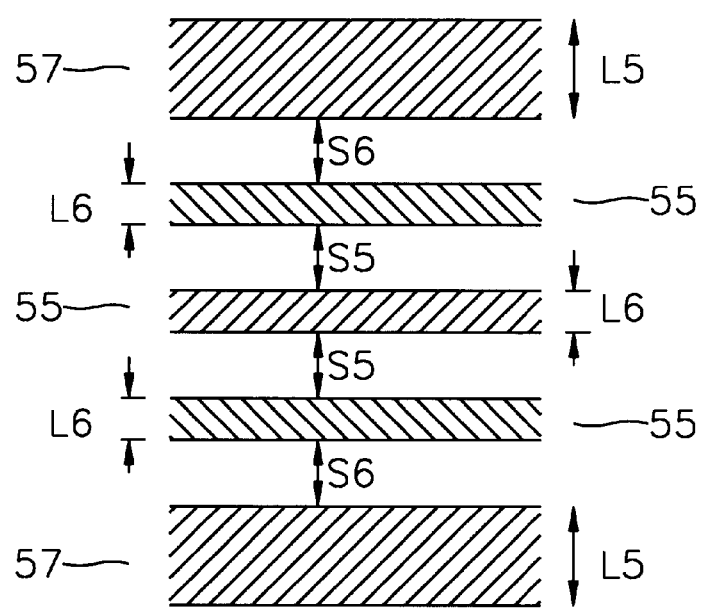
FIG. 6 is an enlarged view of part C of the power lines and the column select lines of FIG. 5.

FIGS. 5 and 6 illustrate another embodiment of the present invention. Referring to FIG. 5, integrated circuit memory devices 50 include a column decoder 53 and a memory cell array 51. A plurality of spaced apart control lines, e.g., column select lines 55, and a plurality of spaced apart power lines, e.g., VSS power lines 57, are included on the memory cell array. The control lines and power lines extend along a predetermined direction, shown as horizontal. The column select lines 55 are connected to the column decoder 53. The VSS power lines 57 are connected to a common VSS line at one end of the memory cell array 51.

FIG. 6 is an enlarged view of part C of the power lines 57 and the column select lines 55 of FIG. 5. Referring to FIG. 6, one of the VSS power lines 57 is arranged per every three column select lines 55. The widths L6 of the column select lines 55 are equal. However, the width L5 of each VSS power line 57 is three times or more the width L6 of the column select line 55, because one power line 57 is arranged per every three column select lines 55. Also, the space S6 between a column select line 55 and a power line 57 is equal to the space S5 between two column select lines 55.

When the width LS of the power lines 57 increases, the resistance of the power lines 57 can be reduced, and the capacitance thereof can be increased. Accordingly, noise generated from the power lines 57 can be reduced.

Referring to FIG. 7, a method for arranging the control lines and the power lines according to the present invention, includes a step 71 of arranging control lines and a step 73 of arranging power lines. In the step 71 of arranging control lines, at least two control lines are arranged in parallel. In the step 73 of arranging power lines, the power lines are arranged between groups of at least two control lines arranged in step 71 parallel to the control lines.

It will be understood that the step 73 of arranging power lines may precede the step 71 of arranging control lines. They also may be arranged simultaneously. The power lines are wider than the control lines, and the space between two adjacent control lines is equal to the space between a power line and an adjacent control line. Accordingly, as the width of the VSS power line of an integrated circuit memory increases, noise generated from the VSS power line may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory comprising:

a memory cell array in an integrated circuit;

a plurality of spaced apart column select lines on the memory cell array extending along a predetermined direction; and a plurality of spaced apart power lines on the memory cell array, extending along the predetermined direction;

wherein at least two spaced apart column select lines are located between adjacent spaced apart power lines;

wherein the spaced apart power lines are wider than the spaced apart column select lines; and wherein the at least two spaced apart column select lines and the spaced apart power lines are spaced apart on the memory cell array.

2. An integrated circuit memory according to claim 1 wherein the space between adjacent column select lines is equal to the space between a power line and an adjacent column select line.

3. An integrated circuit memory according to claim 1 further comprising a column decoder connected to the column select lines.

4. An integrated circuit memory according to claim 1 wherein the power lines are VSS power lines.

5. An integrated circuit memory according to claim 1 wherein the power lines are at least twice as wide as the column select lines.

6. An integrated circuit memory according to claim 1 wherein the at least two spaced apart column select lines is two or three spaced apart column select lines.

7. A method of arranging power distribution in an integrated circuit memory including a memory cell array, the arranging method comprising the steps of:

arranging a pair of spaced apart power lines on the memory cell array extending along a predetermined direction; and arranging at least two spaced apart column select lines adjacent one another on the memory cell array, between the pair of spaced apart power lines and extending along the predetermined direction;

wherein the power lines are wider than the column select lines; and wherein the at least two spaced apart column select lines and the spaced apart power lines are spaced apart on the memory cell array.

8. A method according to claim 7 wherein the space between adjacent column select lines is equal to the space between a power line and an adjacent column select line.

9. A method according to claim 7 further comprising a column decoder connected to the column select lines.

10. A method according to claim 7 wherein the power lines are VSS power lines.

11. A method according to claim 7 wherein the power lines are at least twice as wide as the column select lines.

12. A method according to claim 7 wherein the at least two spaced apart column select lines is two or three spaced apart column select lines.

13. An integrated circuit memory comprising:

a memory cell array in an integrated circuit;

a plurality of spaced apart control lines on the memory cell array extending along a predetermined direction; and a plurality of spaced apart power lines on the memory cell array extending along the predetermined direction;

wherein only three spaced apart control lines are located between adjacent spaced apart power lines;

wherein the spaced apart power lines are at least three times as wide as the spaced apart control lines; and wherein the space between adjacent control lines is equal to the space between a power line and an adjacent control line.

14. An integrated circuit memory according to claim 1 wherein the control lines are column select lines, the integrated circuit memory further comprising a column decoder connected to the column select lines.

15. An integrated circuit memory according to claim 1 wherein the power lines are VSS power lines.

16. An integrated circuit memory according to claim 1 wherein the power lines are three times as wide as the control lines.

17. A method of arranging power distribution in an integrated circuit memory including a memory cell array, the arranging method comprising the steps of:

arranging a pair of spaced apart power lines on the memory cell array extending along a predetermined direction; and arranging only three spaced apart control lines adjacent one another between the pair of spaced apart power lines and extending along the predetermined directions;

wherein the power lines are at least three times as wide as the control lines; and wherein the space between adjacent control lines is equal to the space between a power line and an adjacent control line.

* * * * *